(12) United States Patent
Kikuchi

(10) Patent No.: US 6,861,178 B2
(45) Date of Patent: Mar. 1, 2005

(54) PHASE SHIFT MASK, METHOD OF EXPOSURE, AND METHOD OF PRODUCING SEMICONDUCTOR DEVICE

(75) Inventor: Koji Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 157 days.

(21) Appl. No.: 10/154,263

(22) Filed: May 23, 2002

(65) Prior Publication Data

US 2002/0177051 A1 Nov. 28, 2002

(30) Foreign Application Priority Data

May 24, 2001 (JP) ..................................... P2001-155917

(51) Int. Cl.⁷ .............................. G03F 9/00; G03C 5/00
(52) U.S. Cl. ......................... 430/5; 430/311; 430/312; 430/313; 430/394
(58) Field of Search .......................... 430/5, 311–313, 430/394

(56) References Cited

U.S. PATENT DOCUMENTS 5,650,854 A * 7/1997 Sugawara ................... 356/394
6,534,224 B2 * 3/2003 Lukanc ........................... 430/5
6,576,377 B2 * 6/2003 Kikuchi ....................... 430/311

* cited by examiner

*Primary Examiner*—Geraldine Letscher
(74) *Attorney, Agent, or Firm*—Sonnenschein, Nath & Rosenthal LLP

(57) ABSTRACT

A phase shift mask including a first phase shifter through which light passes by a first optical path length; a second phase shifter through which light passes by a second optical path length inverted in an optical phase from the first optical path length, the second phase shifter formed away from the first phase shifter by a predetermined distance; a light-blocking part formed around the first phase shifter and second phase shifter; and a correction pattern provided at a part of at least one of the first phase shifter and second phase shifter for correcting a distribution of light intensity between light passing through the first phase shifter and light passing through the second phase shifter, and method of exposure and method of producing a semiconductor device using the phase shift mask.

13 Claims, 16 Drawing Sheets

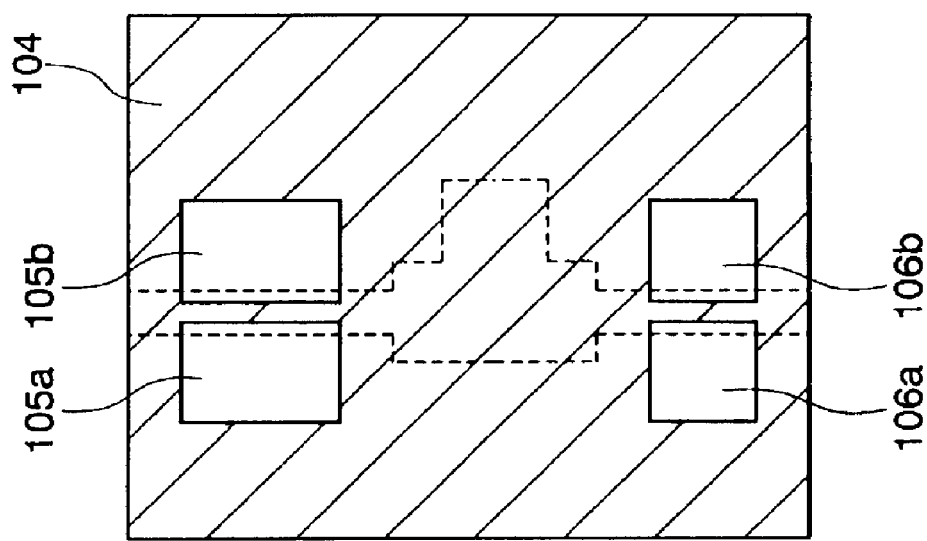
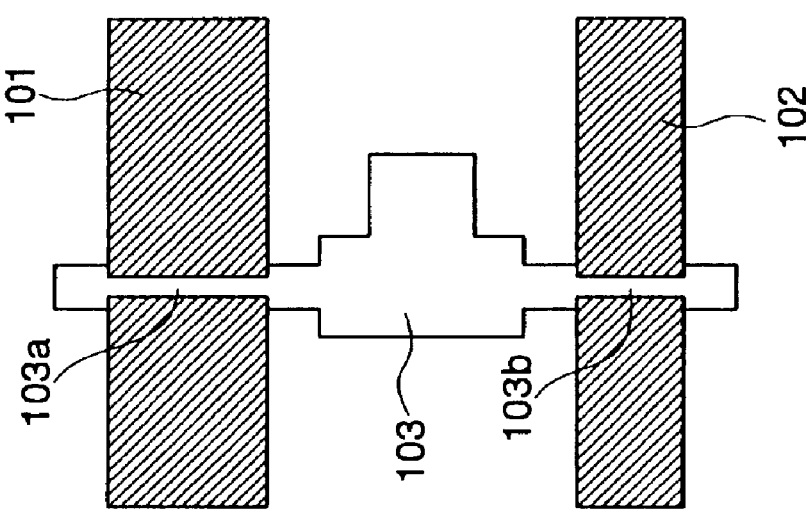

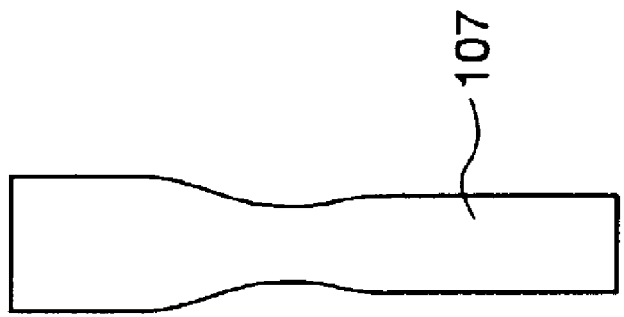
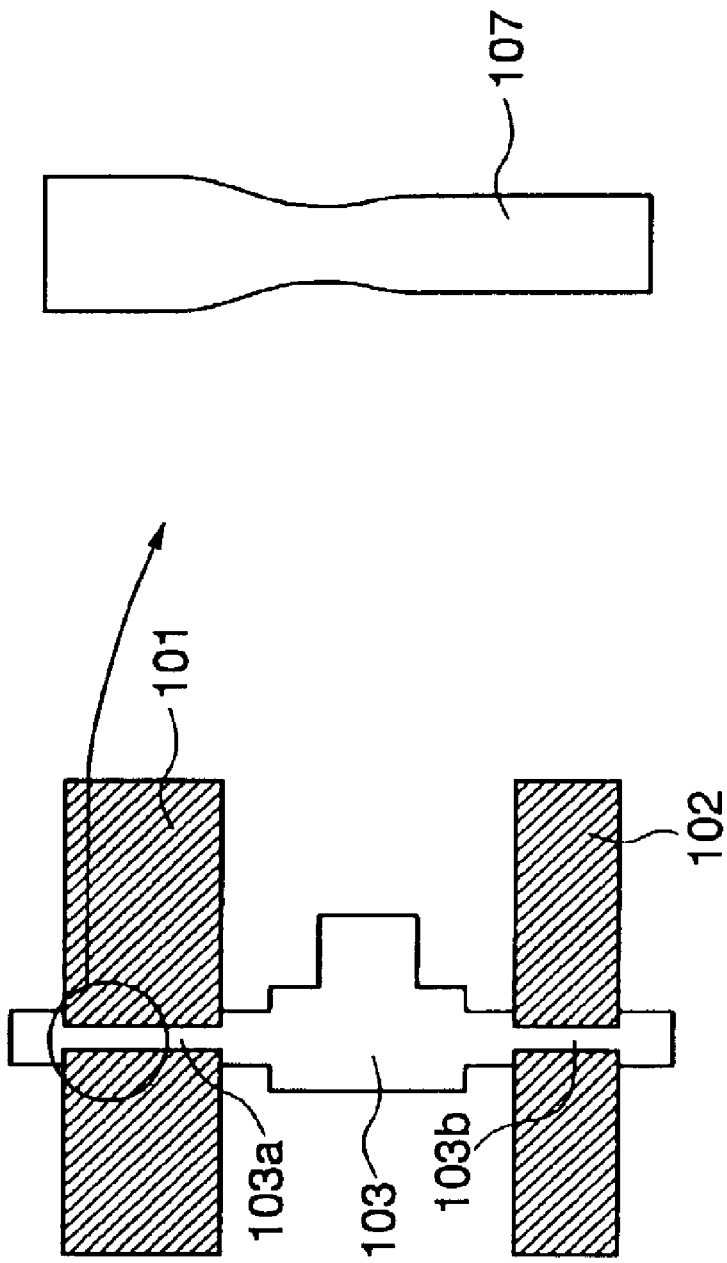

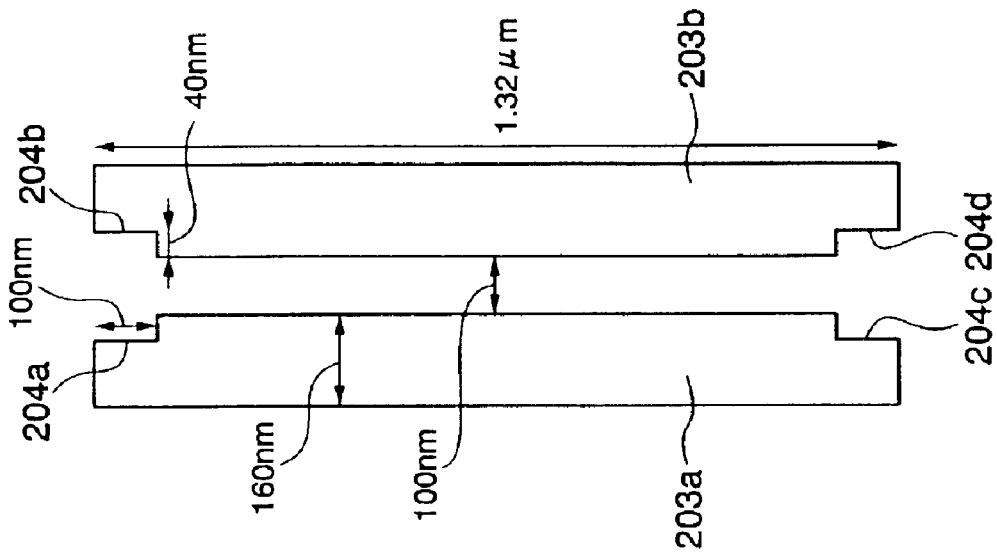
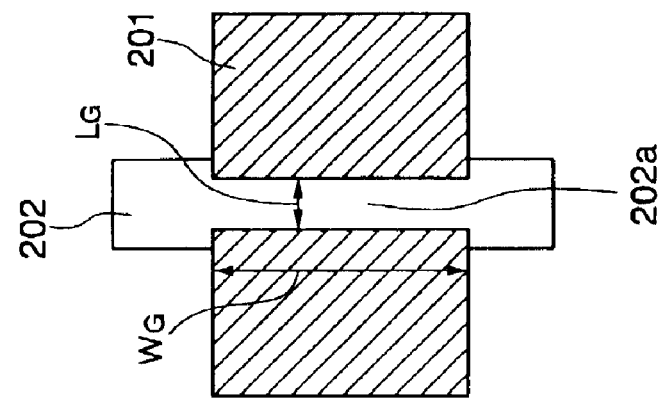

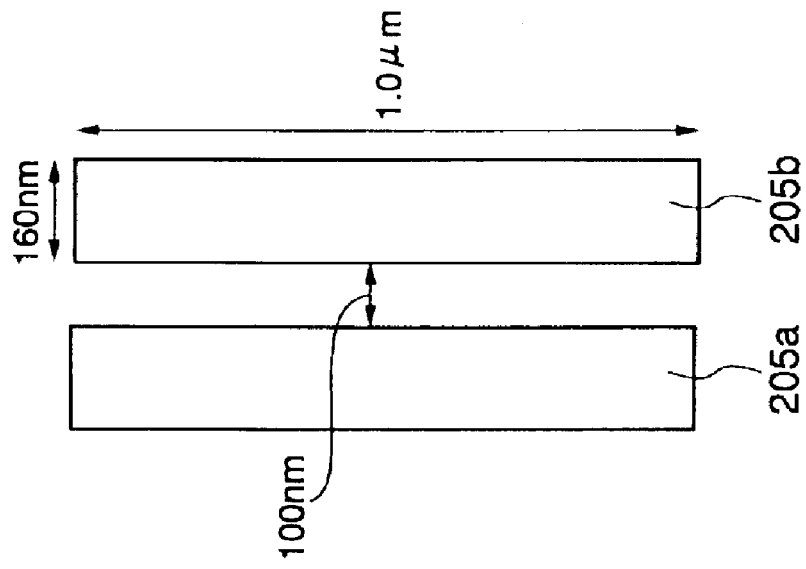
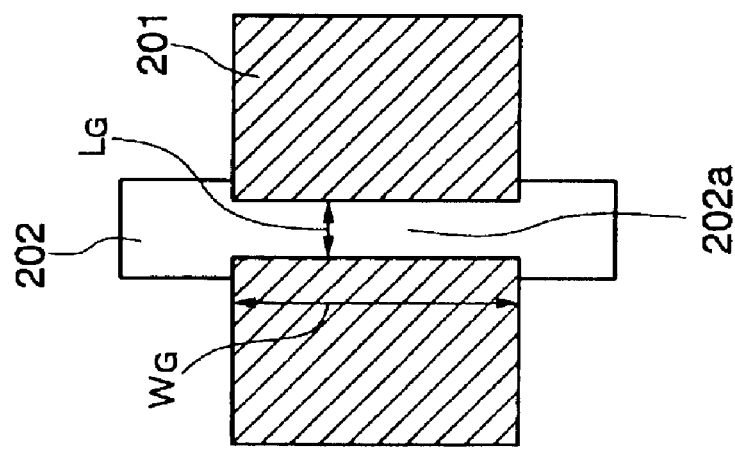

ACTIVE REGION

PHASE SHIFT MASK, METHOD OF EXPOSURE, AND METHOD OF PRODUCING SEMICONDUCTOR DEVICE

BACKGROUND OF THE INVENTION

1. Field of the Invention

The present invention relates to a phase shift mask used in a photolithography process for forming a miniaturized pattern on a semiconductor device etc. and to a method of exposure and a method of producing a semiconductor device using the same, in particular a phase shift mask, a method of exposure, and a method of producing a semiconductor device able to make a line width of a miniaturized pattern uniform.

2. Description of the Related Art

Along with improvements in the performance of semiconductor devices, greater miniaturization and higher density packaging have become demanded in the semiconductor production process. Therefore, when forming resist patterns by photolithography, it is also required to form miniaturized patterns exceeding the resolution limit determined by the wavelength of the light and optical system.

In recent years, as a method for forming a miniaturized pattern of less than the exposure wavelength, a multiple exposure method using a Levenson phase shift mask has been employed. This method of exposure comprises exposure using a Levenson phase shift mask and exposure using a mask other than a Levenson phase shift mask.

As a mask other than a Levenson phase shift mask, usually a binary mask comprised of a light-blocking film formed with apertures passing light is used. However, it is also possible to perform the multiple exposure by combining a half-tone type phase shift mask using a material having a certain transmittance as a light-blocking film etc. together with a Levenson phase shift mask.

When performing exposure using a Levenson phase shift mask, miniaturized patterns exceeding the resolution limit determined by the wavelength of the light and optical system can be transferred, but unnecessary patterns are generated between regions opposite in phase because of the decrease in light intensity. To eliminate the unnecessary patterns and form patterns not requiring as high a resolution as with a Levenson phase shift mask, at least two exposures are performed.

The multiple exposure method using a Levenson phase shift mask has already been applied commercially for forming gate layers of a high-speed LSI or ULSI etc. A gate layer of a ULSI requires a high controllability of line width in the patterns forming the gate electrodes, so a phase shift mask comprised of an array of phase shifters is used at the pattern forming parts.

FIG. 1A shows an example of the gate layer of a ULSI. As shown in FIG. 1A, an active region 101 of a PMOS and an active region 102 of an NMOS are formed in a substrate. A gate layer 103 is formed on the substrate. The gate layer 103 is comprised of for example polysilicon. The miniaturized pattern parts on the active regions 101 and 102 are the gate electrodes 103a and 103b. A channel is formed below them.

The gate layer 103 at the portions other than the active regions 101 and 102 is formed with a gate contact. For decreasing the resistivity of interconnections, facilitating fabrication of the pattern, etc., the gate layer 103 is made a relatively thick line width at portions other than the gate electrodes 103a and 103b. The portions other than the active regions 101 and 102 and gate layer 103 are element isolation regions.

FIG. 1B shows mask patterns when forming resist patterns for forming the gate layer 103 of FIG. 1A by the multiple exposure method. Here, an example of multiple exposure using a Levenson phase shift mask and binary mask is shown. The resist is assumed to be a positive type resist.

The solid lines in FIG. 1B show the patterns of the Levenson phase shift mask. The hatched portion shows a light-blocking part 104 of the Levenson phase shift mask. Light passes through the phase shifters 105a, 105b, 106a, and 106b other than the light-blocking part 104. The phase shifters 105a and 105b differ from each other in thickness (or optical path length). Due to this, the phase of the light passing through the phase shifters 105a and 105b is inverted. Between the phase shifters 105a and 105b, the light intensity becomes smaller and the resist remains in a narrow line width.

In the same manner, the phase shifters 106a and 106b differ from each other in optical path lengths. Due to this, between the phase shifters 106a and 106b, the resist remains in a narrow line width.

On the other hand, the dotted lines of FIG. 1B show the pattern of the binary mask. This corresponds to the pattern of the gate layer 103 of FIG. 1A in the portion other than the gate electrodes 103a and 103b of FIG. 1A.

The exposure using the Levenson phase shift mask of FIG. 1B and exposure using the binary mask can be performed in any sequence. After the multiple exposure, the resist is developed to form the resist patterns. Using the resist patterns as a mask, the for example polysilicon layer is dry etched to obtain the gate layer 103 shown in FIG. 1A.

However, when using the conventional Levenson phase shift mask described above for exposing the resist, it is not possible to make the line width of the resist constant at the miniaturized patterns of the gate electrodes. A resist for forming the circled part in the gate layer 103 shown in FIG. 2A is shown enlarged in FIG. 2B.

As shown in FIG. 2B, the line width of the resist 107 becomes narrower in the longitudinal direction of the gate electrode (gate width direction) from the center part toward one end. On the other hand, at the end of the gate electrode in the gate width direction, the line width of the resist 107 sharply increases. When forming the gate electrode 103a (see FIG. 2A) by using such a resist 107 as a mask, the gate electrode 103a becomes locally narrow near that one end.

In the same way, the resist line width fluctuates at the other end of the gate electrode 103a or both ends of the gate electrode 103b of FIG. 2A. Therefore, a gate electrode 103a with a uniformly narrow line width cannot be obtained on the active region 101 such as shown in FIG. 2A. The gate electrode 103b on the active region 102 also does not have a uniform line width.

For example, in the case of a CMOS circuit shown in FIG. 2A, due to the local thinning in the line widths of the gate electrodes 103a and 103b, leakage etc. is easily induced and the circuit no longer functions as a CMOS circuit.

Japanese Patent No. 2892014 (Japanese Unexamined Patent Publication (Kokai) No. 2-39152) discloses a method of exposure able to improve the uniformity of line width when forming adjacent slit-type patterns by photolithography. According to this method of exposure, as shown in FIG. 3, a mask 114 comprising rectangular patterns 112 and 113 on a support 111 is used for exposure. At the corners of the mask patterns 112 and 113, jog parts 114 and 115 are provided.

If the jog parts 114 and 115 were not formed at the mask patterns 112 and 113, the distribution of light intensity in the part enclosed by the dotted line of FIG. 3 would become as shown in FIG. 4A. As shown in FIG. 4A by the arrow, the light intensity would locally increase near the corners of the patterns and the line width of the resist would fluctuate at these parts.

On the other hand, as shown in FIG. 3, due to the provision of the jog parts 114 and 115 on the mask patterns 112, 113, it becomes possible to make the distance between the transferred patterns constant as shown in FIG. 4B.

However, since the above mask is a binary mask, it cannot be applied to form a miniaturized pattern exceeding the resolution limit determined by the wavelength of the light and the optical system. Also, in the case of the above method of exposure, along with the distance between the patterns becoming constant, rounded shapes at the ends of the patterns become more prominent. Therefore, when miniaturizing patterns, this is sometimes conversely disadvantageous in forming patterns with a high precision.

SUMMARY OF THE INVENTION

An object of the present invention is to provide a phase shift mask able to correct the distribution of light intensity between phase shifters and prevent fluctuation in line width of a miniaturized pattern.

Another object of the present invention is to provide a method of exposure able to prevent fluctuation in line width in formation of a miniaturized pattern including exposure using a Levenson phase shift mask.

Another object of the present invention is to provide a method of producing a semiconductor device able to form a miniaturized pattern with a uniform line width in a photolithography process.

According to a first aspect of the present invention, there is provided a phase shift mask comprising a first phase shifter through which light passes by a first optical path length; a second phase shifter through which light passes by a second optical path length inverted in an optical phase from the first optical path length, the second phase shifter formed away from the first phase shifter by a predetermined distance; a light-blocking part formed around the first phase shifter and second phase shifter; and a correction pattern provided at a part of at least one of the first phase shifter and second phase shifter for correcting a distribution of light intensity between light passing through the first phase shifter and light passing through the second phase shifter.

Preferably, the first phase shifter and second phase shifter are shaped so that the light intensity is canceled out in a line shape between the light passing through the first phase shifter and the light passing through the second phase shifter; and the correction pattern is shaped so that a line width of the line-shaped part becomes constant.

Preferably, the correction pattern is shaped to cut away at least one corner of the first and/or second phase shifter.

Preferably, a length of a portion where the first phase shifter and second phase shifter face each other is longer than a desired length of the line-shaped portion. More preferably, the facing portion includes parts outside of the two ends of the line-shaped portion in a longitudinal direction.

Preferably, the phase shift mask of the present invention has a plurality of at least the first phase shifter, and the first phase shifters are arranged via the second phase shifter.

Due to this, it becomes possible to prevent a fluctuation in line width of a miniaturized pattern formed by light passing through the first and second phase shifters. Specifically, it is possible to prevent the line width from becoming narrower from the center to the end of the phase shifter in the longitudinal direction. Further, it is possible to prevent the line width from becoming sharply thicker near an end of the phase shifter in the longitudinal direction.

According to a second aspect of the present invention, there is provided a method of exposure performing a first exposure via a phase shift mask comprising using a phase shift mask comprising a first phase shifter through which light passes by a first optical path length; a second phase shifter through which light passes by a second optical path length inverted in an optical phase from the first optical path length, the second phase shifter formed away from the first phase shifter by a predetermined distance; a light-blocking part formed around the first phase shifter and second phase shifter; and a correction pattern provided at a part of at least one of the first phase shifter and second phase shifter for correcting a distribution of light intensity between light passing through the first phase shifter and light passing through the second phase shifter.

Preferably, the first phase shifter and second phase shifter are shaped so that the light intensity is canceled out in a line shape between the light passing through the first phase shifter and the light passing through the second phase shifter; and the correction pattern is shaped so that a line width of the line-shaped part becomes constant.

Preferably, the method of exposure further comprises, before or after the first exposure, a step of second exposure via a second mask formed with a different pattern from the phase shift mask.

Preferably, the correction pattern is shaped to cut away at least one corner of the first and/or second phase shifter. Preferably, a length of a portion where the first phase shifter and second phase shifter face each other is longer than a desired length of the line-shaped portion. More preferably, the facing portion includes parts outside of the two ends of the line-shaped portion in a longitudinal direction.

Due to this, it becomes possible to prevent a fluctuation in line width in fabrication of a miniaturized pattern formed exposure using a Levenson phase shift mask. Specifically, it is possible to prevent the line width from becoming narrower from the center to the end of the phase shifter in the longitudinal direction. Further, it is possible to prevent the line width from becoming sharply thicker near an end of the phase shifter in the longitudinal direction.

Further, if performing the second exposure in addition to the exposure using the Levenson phase shift mask, it is possible to cover over a change of shape of the end of a pattern caused by lengthening the shape of a phase shifter in the longitudinal direction.

According to a third aspect of the present invention, there is provided to a method of producing a semiconductor device including a step of focusing light on a substrate via a phase shift mask to transfer a pattern to the substrate comprising using a phase shift mask comprising a first phase shifter through which light passes by a first optical path length; a second phase shifter through which light passes by a second optical path length inverted in an optical phase from the first optical path length, the second phase shifter formed away from the first phase shifter by a predetermined distance; a light-blocking part formed around the first phase shifter and second phase shifter; and a correction pattern provided at a part of at least one of the first phase shifter and second phase shifter for correcting a distribution of light intensity between light passing through the first phase shifter and light passing through the second phase shifter.

Due to this, it becomes possible to prevent a fluctuation in line width in fabrication of a miniaturized pattern formed exposure using a Levenson phase shift mask. Specifically, it is possible to prevent the line width from becoming narrower from the center to the end of the phase shifter in the longitudinal direction. Further, it is possible to prevent the line width from becoming sharply thicker near an end of the phase shifter in the longitudinal direction. Therefore, it becomes possible to form a miniaturized pattern of for example a gate layer at a high precision.

BRIEF DESCRIPTION OF THE DRAWINGS

These and other objects and features of the present invention will become clearer from the following description of the preferred embodiments given with reference to the accompanying drawings, in which:

FIG. 1A shows an example of the layout of a gate layer;

FIG. 1B shows a mask pattern used for multiple exposure for forming the pattern of FIG. 1A;

FIG. 2A shows an example of the layout of a gate layer;

FIG. 2B shows a resist for forming a part of the gate layer inside a dotted line of FIG. 2A;

FIGS. 4A and 4B show the results of simulation of the light intensity at the part inside of the dotted line of FIG. 3, wherein FIG. 4A shows a case without correction patterns and FIG. 4B shows a case with correction patterns (jogs);

FIG. 5A shows the layout of a gate layer according to a first embodiment of the present invention;

FIG. 5B shows phase shifters for forming the pattern of FIG. 5A;

FIG. 8A shows the layout of a gate layer according to the first embodiment of the present invention;

FIG. 8B shows phase shifters of a comparative example for forming the pattern of FIG. 8A;

DESCRIPTION OF THE PREFERRED EMBODIMENTS

Figure 3:
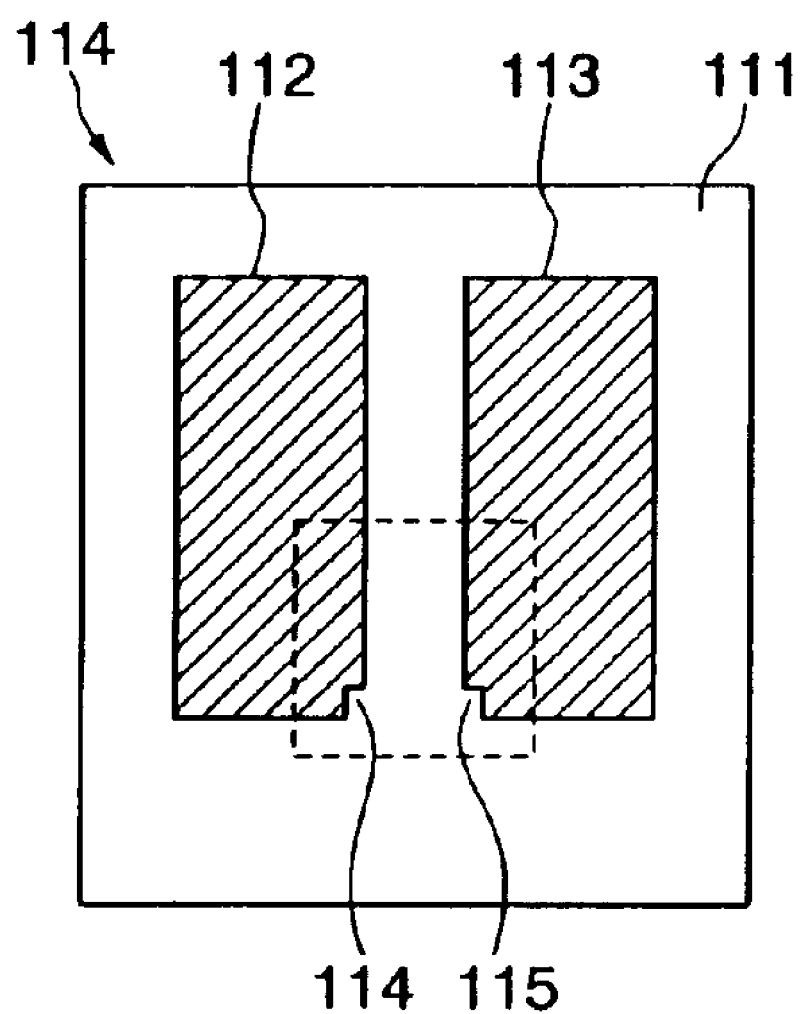
FIG. 3 shows a conventional mask having correction patterns.
Figure 4B:
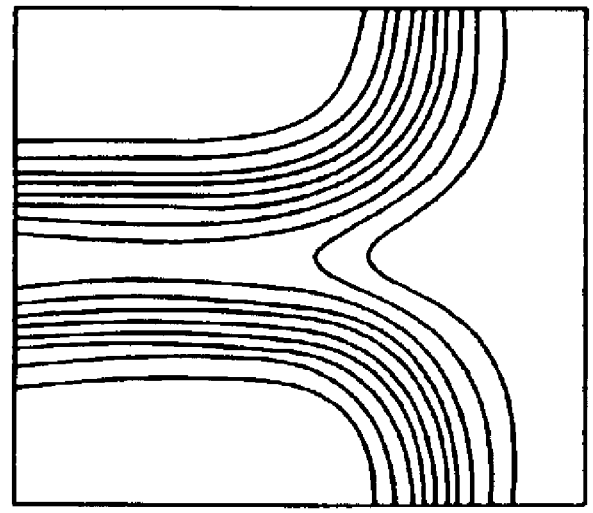
Figure 4A:
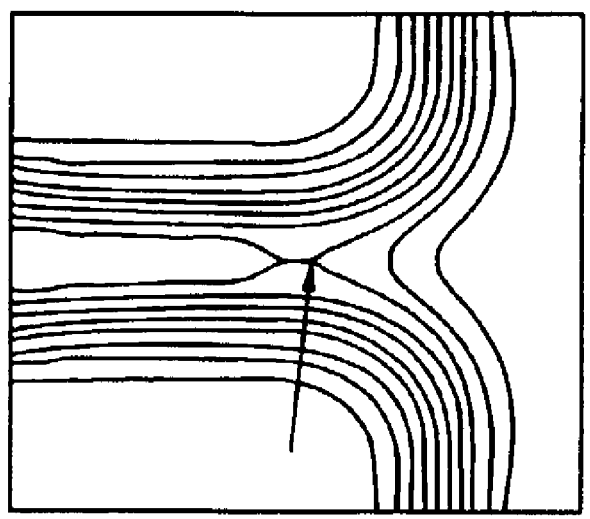

Below, preferred embodiments will be described with reference to the accompanying drawings.

The technique of multiple exposure using a Levenson phase shift mask is generally applied to the fabrication of a gate layer or other line-type pattern of an ULSI. The following embodiments show examples of application of the present invention to a 0.13 μm generation logic test pattern. Two patterns were sampled as representative patterns and set as first and second embodiments.

First Embodiment

FIG. 5A shows the layout of a test pattern of the present embodiment. The pattern shown in FIG. 5A is assumed here to be an isolated pattern with no other gate in its surroundings.

As shown in FIG. 5A, an active region 201 is formed in a substrate. A gate layer 202 is formed on the substrate. The gate layer 202 is composed of for example polysilicon. The miniaturized pattern portion on the active region 201 is a gate electrode 202a. Below this, a channel is formed. In the pattern shown in FIG. 5A, a gate length $L_G$ is assumed to be 0.10 μm and a gate width $W_G$ 1.0 μm.

FIG. 5B shows phase shifters for forming the test pattern shown in FIG. 5A. The optical path lengths of a phase shifter 203a and a phase shifter 203b are different from each other. Therefore, the phases of the light passing through the phase shifters 203a and 203b are inverted. As shown in FIG. 5B, the phase shifters 203a and 203b are longer at both ends in the longitudinal direction by 160 nm from the gate width $W_G$ of FIG. 5A. Therefore, the lengths of the phase shifters 203a are 203b are 1.32 μm. Further, the widths of the phase shifters 203a and 203b are 160 nm. The distance between the phase shifter 203a and the phase shifter 203b is 100 nm.

As shown in FIG. 5B, the phase shifters 203a and 203b have jog part 204a, 204b, 204c, and 204d. The jog parts are located facing each other. Based on the results of optimization by simulation of the light intensity explained later, the jog parts are formed 100 nm in length and 40 nm in width.

Figure 6:
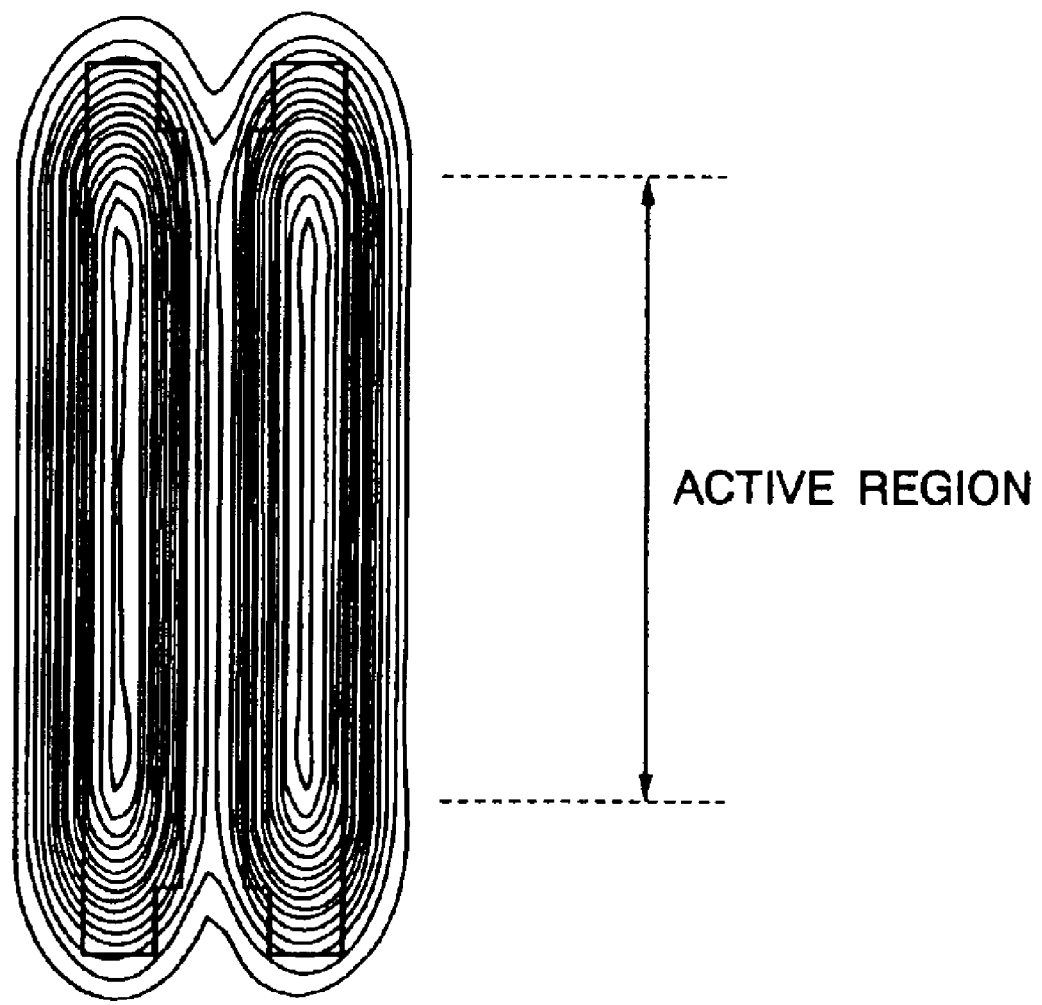
FIG. 6 shows the results of simulation of the light intensity at the phase shifters of FIG. 5B.

FIG. 6 shows the results of simulation of the light intensity for light passing through the phase shifters 203a and 203b in FIG. 5B. The simulation conditions were a wavelength of the light source of set at 248 nm, a numerical aperture NA of 0.60, and a coherence factor a of 0.53. The coherence factor a expresses the interference of light of an exposure apparatus.

By increasing the length of the phase shifter and providing the jog parts at the ends of the phase shifters, as shown in FIG. 6, unevenness of line width is prevented. Also, at the ends of the phase shifters in the longitudinal direction, the corner parts of the transferred image are rounded, but these rounded parts are outside of the active regions. Therefore, the influence of the rounded parts on the line width can be decreased.

Also, normally, some of the interconnections are formed so as to perpendicularly intersect the longitudinal direction of the gate electrode. Therefore, the ends of the transferred image of a Levenson phase shift mask can be covered and concealed by further exposure using for example a binary mask or half-tone type phase shift mask.

Figure 7:
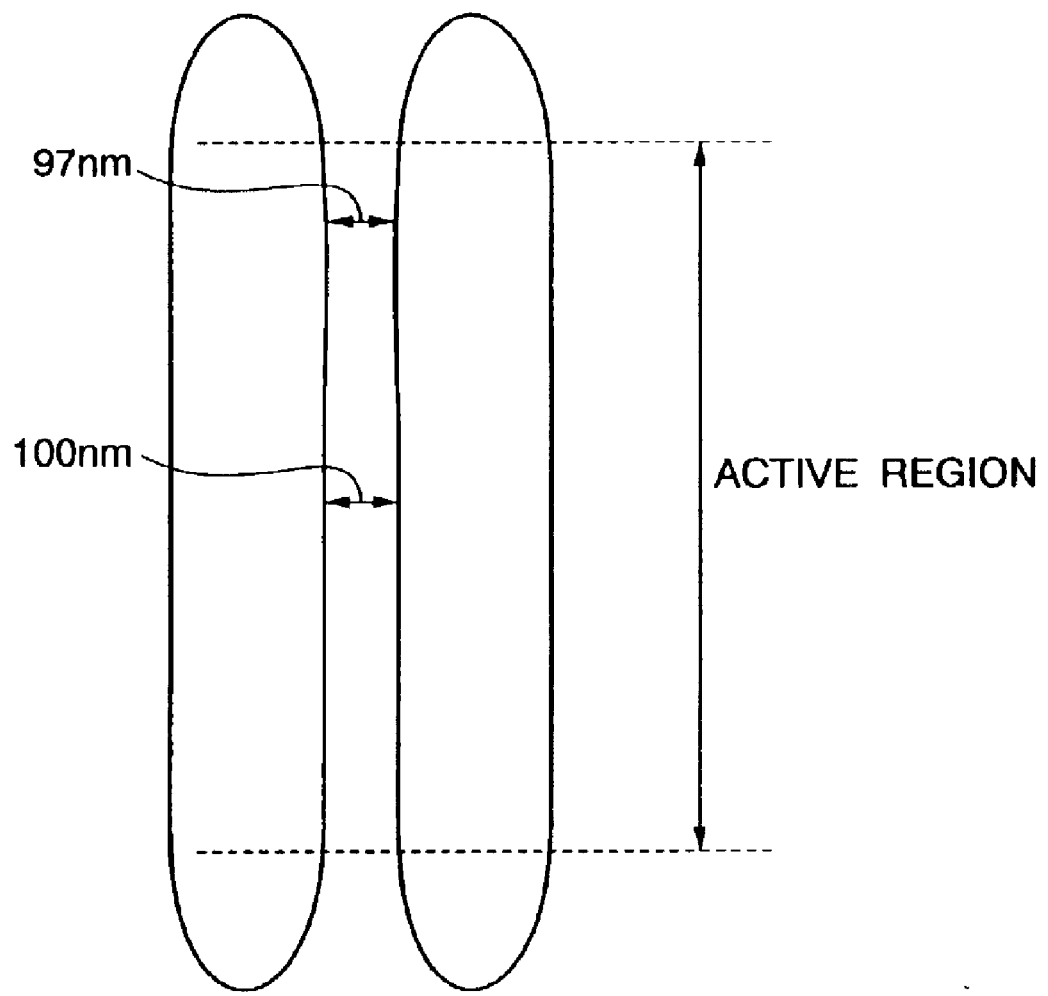
FIG. 7 shows the extracted distribution of light intensity when a line width at the center parts of the phase shifters becomes 100 nm from FIG. 6.

FIG. 7 shows an extracted pattern having a line width at the center parts of the phase shifters of 100 nm based on results of simulation of the light intensity of FIG. 6. As shown in FIG. 7, when the line width is determined by the threshold of the light intensity where the line width at the center parts becomes 100 nm, the minimum line width is 97 nm.

As explained above, according to the patterns of the phase shifters of a Levenson phase shift mask of the present embodiment, it is possible to form a narrow gate electrode on an active region by a substantially constant line width.

FIG. 8A shows a test pattern the same as in FIG. 5A, while FIG. 8B shows conventional phase shifters for fabricating the test pattern of FIG. 8A as comparison. The optical path lengths of the phase shifter 205a and phase shifter 205b are different from each other. Due to this, the phases of the light passing through the phase shifters 205a and 205b are inverted. The phase shifters 205a and 205b have rectangular shapes of 1.0 μm length and 160 nm width. The distance between the phase shifter 205a and phase shifter 205b is 100 nm.

Figure 9:
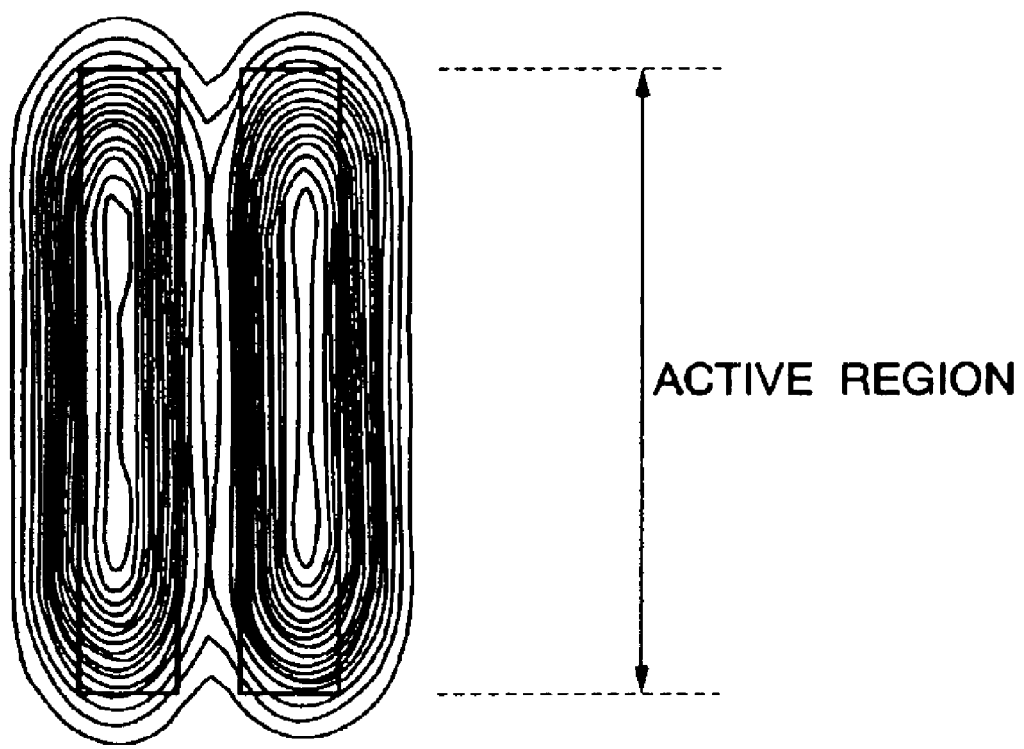
FIG. 9 shows the results of simulation of the light intensity at the phase shifters of FIG. 8B.

FIG. 9 shows the results of simulation of the light intensity for the phase shifters of FIG. 8B using the same conditions as described above. As shown in FIG. 9, at the center parts of the phase shifters in the longitudinal direction, the light intensity between the phase shifter 205a and phase shifter 205b becomes smaller compared with the ends in the longitudinal direction. Also, at the ends in the longitudinal direction, the distribution of light intensity becomes rounded, so the light intensity at the corner parts becomes weak. As explained above, peanut-shaped distributions of light intensity are observed in FIG. 9.

Figure 10:
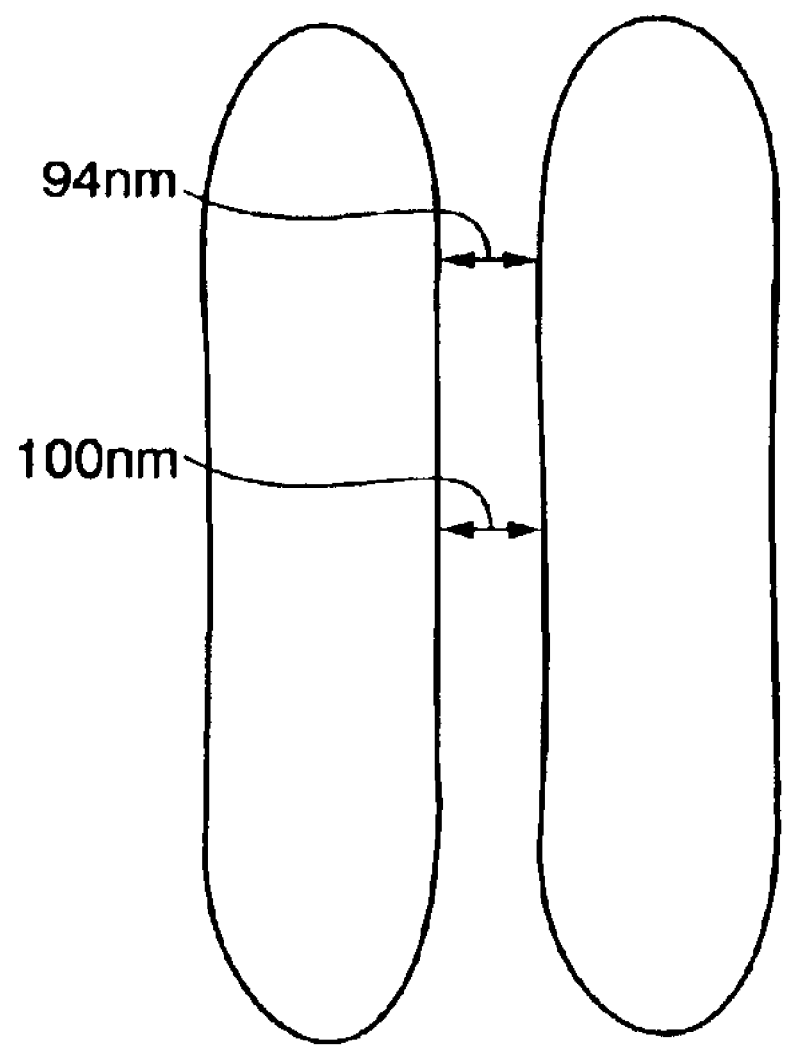
FIG. 10 shows the extracted distribution of light intensity when a line width at the center parts of the phase shifters becomes 100 nm from FIG. 9.

FIG. 10 shows an extracted pattern having a line width at the center parts of the phase shifters of 100 nm based on the results of simulation of the light intensity of FIG. 9. As shown in FIG. 10, when the line width is determined by the threshold of light intensity where the line width at the center parts becomes 100 nm, the line width becomes narrower toward the ends in the longitudinal direction. The line width becomes 94 nm at the minimum.

Comparing FIG. 10 with FIG. 7, it is found that the evenness of line width of a miniaturized pattern on an active region is improved by the Levenson phase shift mask of the present embodiment.

The method of exposure and method of producing a semiconductor device of the present embodiment include a step of photolithography using a Levenson phase shift mask formed with the phase shifters of the present embodiment. Due to this, it becomes possible to form a miniaturized pattern exceeding a resolution limit determined by the wavelength of the light and optical system by a uniform line width.

Second Embodiment

Figure 11B:
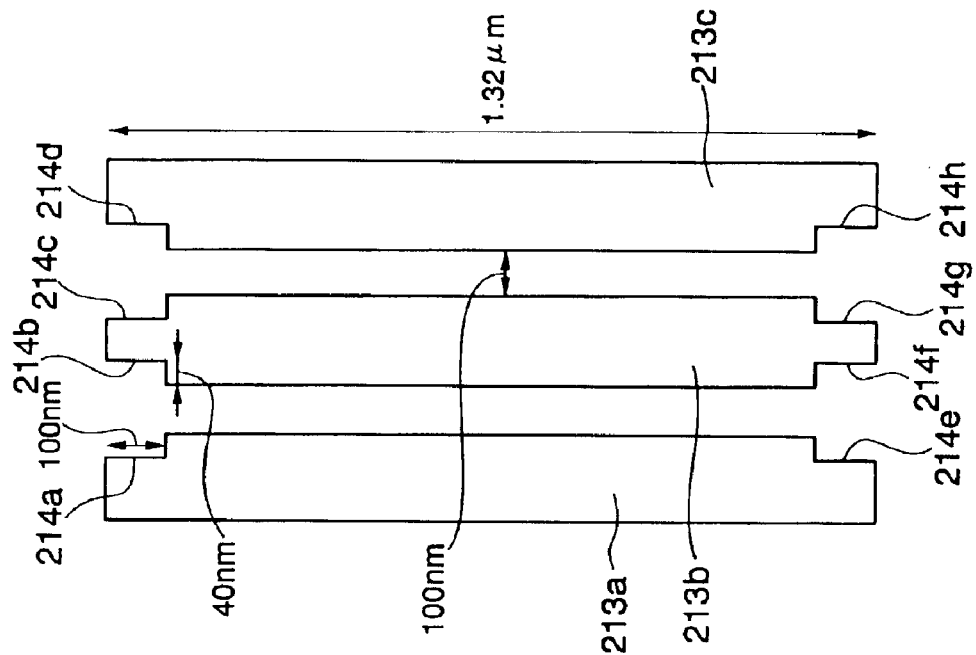
FIG. 11B shows phase shifters for forming the patterns of FIG. 11A.
Figure 11A:
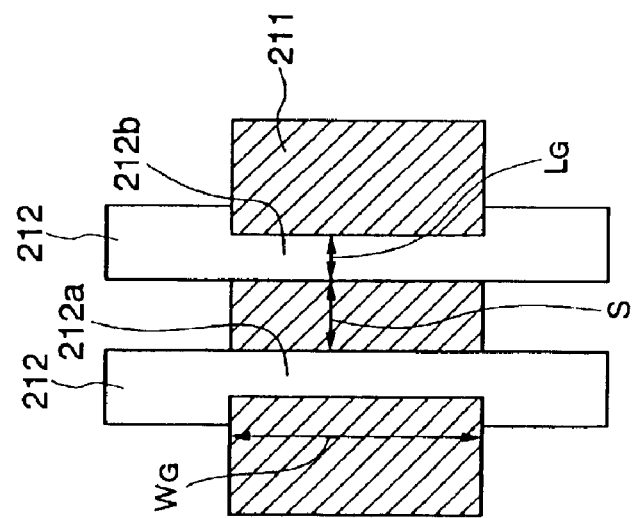
FIG. 11A shows the layout of a gate layer according to a second embodiment of the present invention.

FIG. 11A shows the layout of test patterns of the present embodiment. The patterns shown in FIG. 11A are assumed to gates adjoining each other by a 0.10 μm generation minimum pitch of 0.26 μm.

As shown in FIG. 11A, an active region 211 is formed in a substrate and a gate layer 212 is formed on the substrate. The gate layer 212 is comprised of for example polysilicon in the same manner as the gate layer 202 of FIG. 5A.

The miniaturized patterns on the active region 211 are the gate electrodes 212a and 212b. Channels are formed immediately below them. In the patterns shown in FIG. 11A, a gate length $L_G$ is set at 0.10 μm and the gate width $W_G$ at 1.0 μm. Also, a distance S between the gate electrodes 212a and 212b is 0.16 μm.

FIG. 11B shows phase shifters for forming the test patterns of FIG. 11A. The optical path, lengths of the phase shifters 213a and 213b are different from each other. Due to this, the phases of light passing through the phase shifters 213a and 213b are inverted. On the other hand, the optical path length of the phase shifter 213c is equal to the optical path length of the phase shifter 213a. Due to this, the phases of light passing through the phase shifters 213b and 213c are inverted.

The phase shifters 213a, 213b, and 213c are lengthened at both ends in the longitudinal direction by 0.16 μm each compared with the gate width $W_G$ of FIG. 11A. Therefore, the length of the phase shifters 213a, 213b, and 213c is 1.32 μm. Also, the width of the phase shifters 213a, 213b, and 213c is 160 nm. A distance between adjacent phase shifters is 100 nm.

As shown in FIG. 11B, the phase shifters 213a, 213b, and 213c have jog parts 214a, 214b, 214c, 214d, 214e, 214f, 214g, and 214h at both ends in the longitudinal direction. The jog parts are arranged facing each other. Based on results of optimization by simulation of the light intensity described later, the jog parts are formed to 100 nm in length and 40 nm in width.

Figure 12:
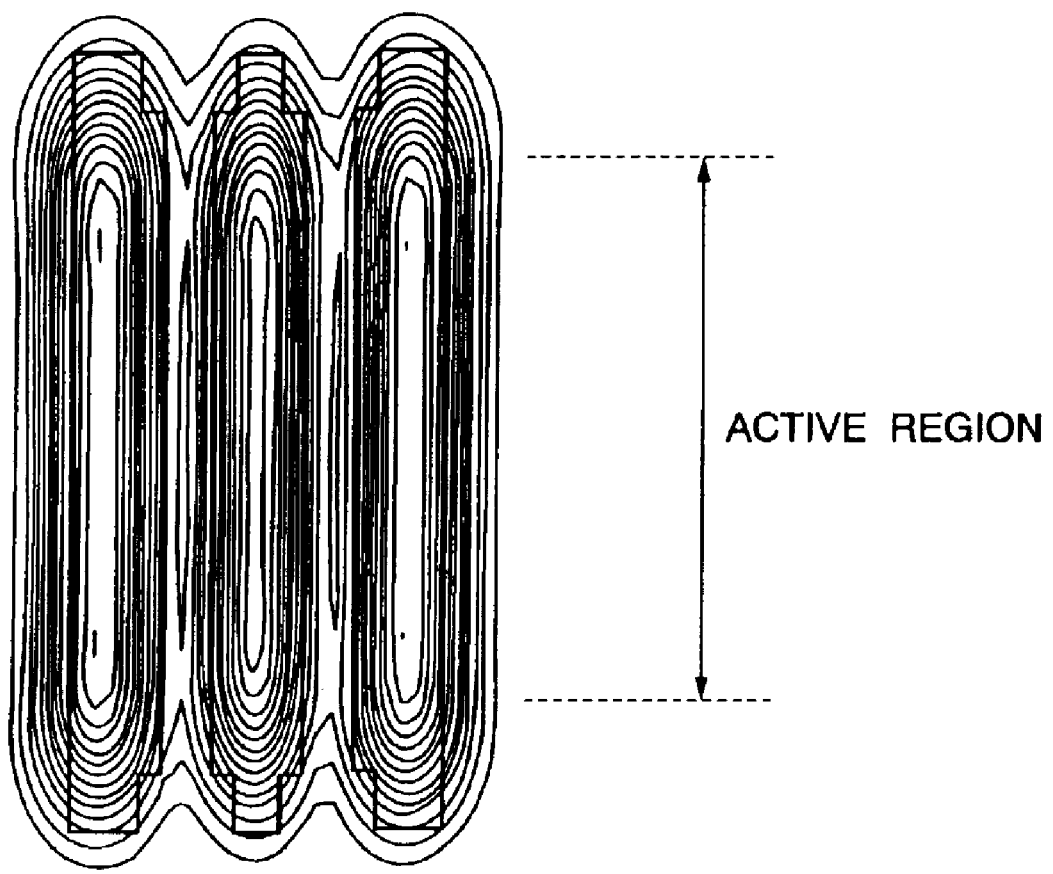
FIG. 12 shows the results of simulation of the light intensity at the phase shifters of FIG. 11B.

FIG. 12 shows the results of simulation of the light intensity for light passing through the phase shifters 213a, 213b, and 213c of FIG. 11B. The simulation conditions were the same as with the simulation of the light intensity of the first embodiment.

Since the phase shifters are made longer and the jog parts are provided at the ends of the phase shifter, unevenness of line width is prevented as shown in FIG. 12. Also, at the ends of the phase shifters in the longitudinal direction, the corner parts of the transferred images become rounded, but these rounded parts are outside of the active region. Therefore, the influence of the rounded parts on the line width can be decreased.

Also, in this portion, normally some of the interconnections are formed perpendicularly intersecting the longitudinal direction of the gate electrodes. Therefore, the ends of the transferred image of the Levenson phase shift mask can be covered and concealed by further exposure using for example a binary mask or half-tone type phase shift mask.

Figure 13:
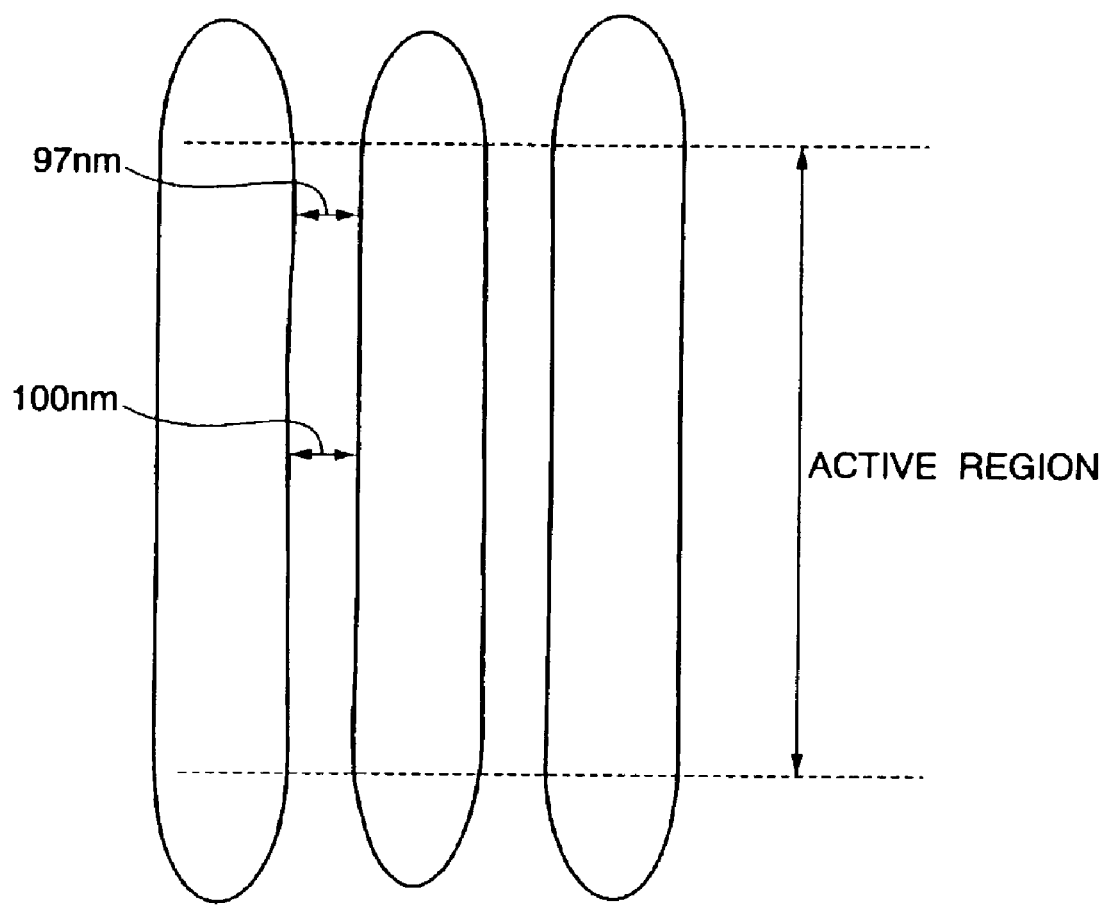
FIG. 13 shows the extracted distribution of light intensity when a line width at the center parts of the phase shifters becomes 100 nm from FIG. 12.

FIG. 13 shows extracted patterns where line widths at center parts of the phase shifters become 100 nm based on the results of simulation of the light intensity of FIG. 12. As shown in FIG. 13, when the line width is determined by the threshold of light intensity where the line width at the center part is 100 nm, the line width becomes 97 nm at the minimum.

As explained above, according to the patterns of the phase shifters of the Levenson phase shift mask of the present embodiment, it is possible to form miniaturized gate electrodes on the active region by substantially constant line widths.

Figure 14A:
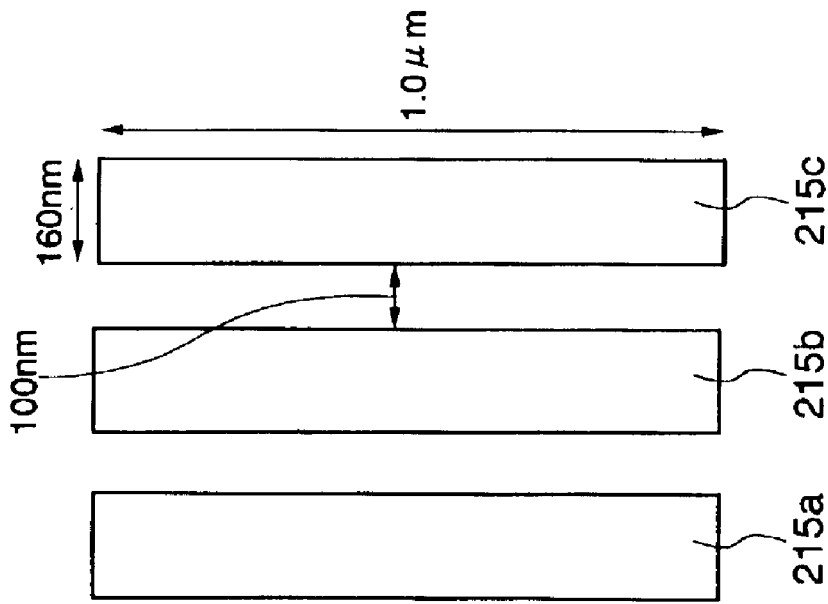
FIG. 14A shows the layout of a gate layer according to the second embodiment of the present invention.

FIG. 14A shows the same test patterns as in FIG. 11A. FIG. 11B shows conventional phase shifters for forming the test patterns of FIG. 14A for comparison. The optical path lengths of the phase shifters 215a and 215b are different from each other. Due to this, the phase of the light passing through the phase shifters 215a and 215b is inverted.

On the other hand, the optical path length of the phase shifter 215c is equal to the optical path length of the phase shifter 215a. Due to this, the phases of light passing through the phase shifters 215b and 215c are inverted. The phase shifters 215a, 215b, and 215c have a rectangular shape of 1.0 μm length and 160 nm width. A distance between adjacent phase shifters is 100 nm.

Figure 14B:
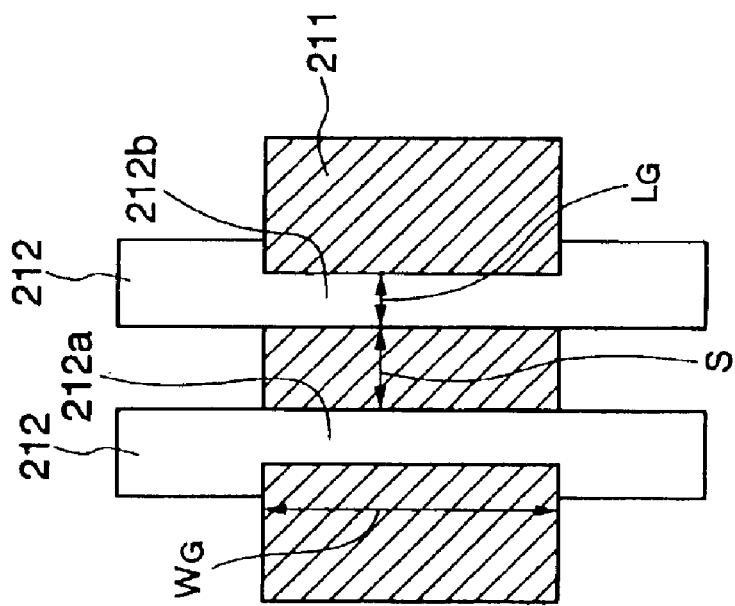
FIG. 14B shows phase shifters of a comparative example for forming the patterns of FIG. 14A.
Figure 15:
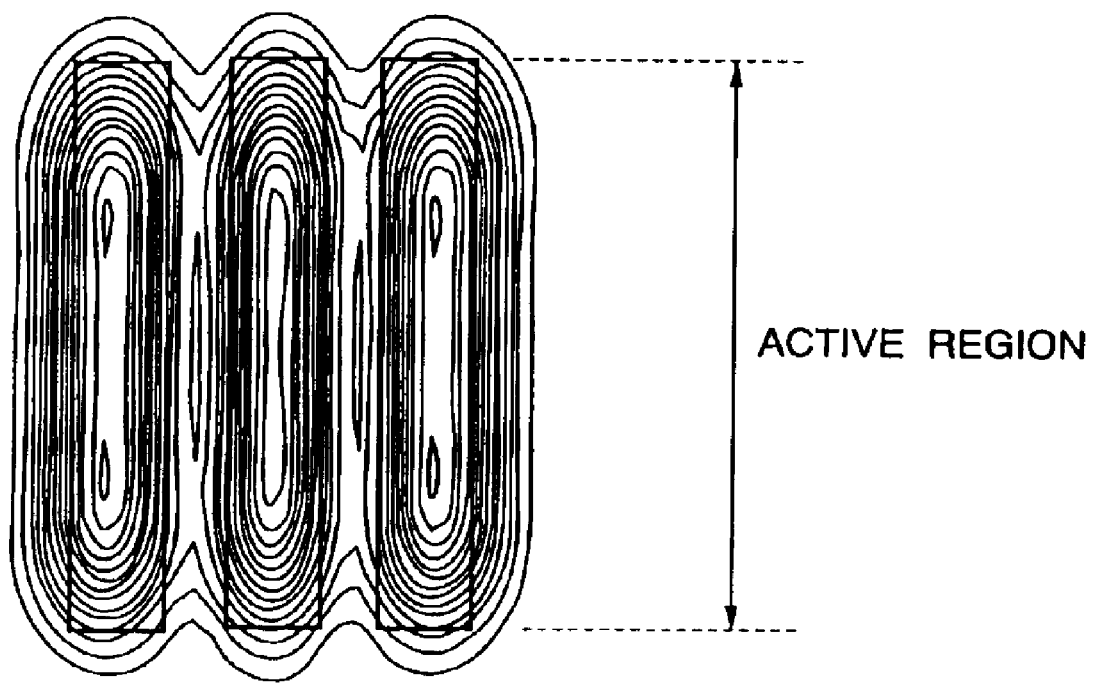
FIG. 15 shows the results of simulation of the light intensity at the phase shifters of FIG. 14B.

FIG. 15 shows the results of simulation of the light intensity for the phase shifters of FIG. 14B under the same conditions as described above. As shown in FIG. 15, at the center parts of the phase shifters in the longitudinal direction, the light intensity between the adjacent phase shifters becomes smaller compared with the ends in the longitudinal direction. Also, at the ends in the longitudinal direction, the distribution of light intensity becomes rounded, so the light intensity at the corner parts becomes weak. As explained above, peanut-shaped distributions of light intensity are observed in FIG. 15.

Figure 16:
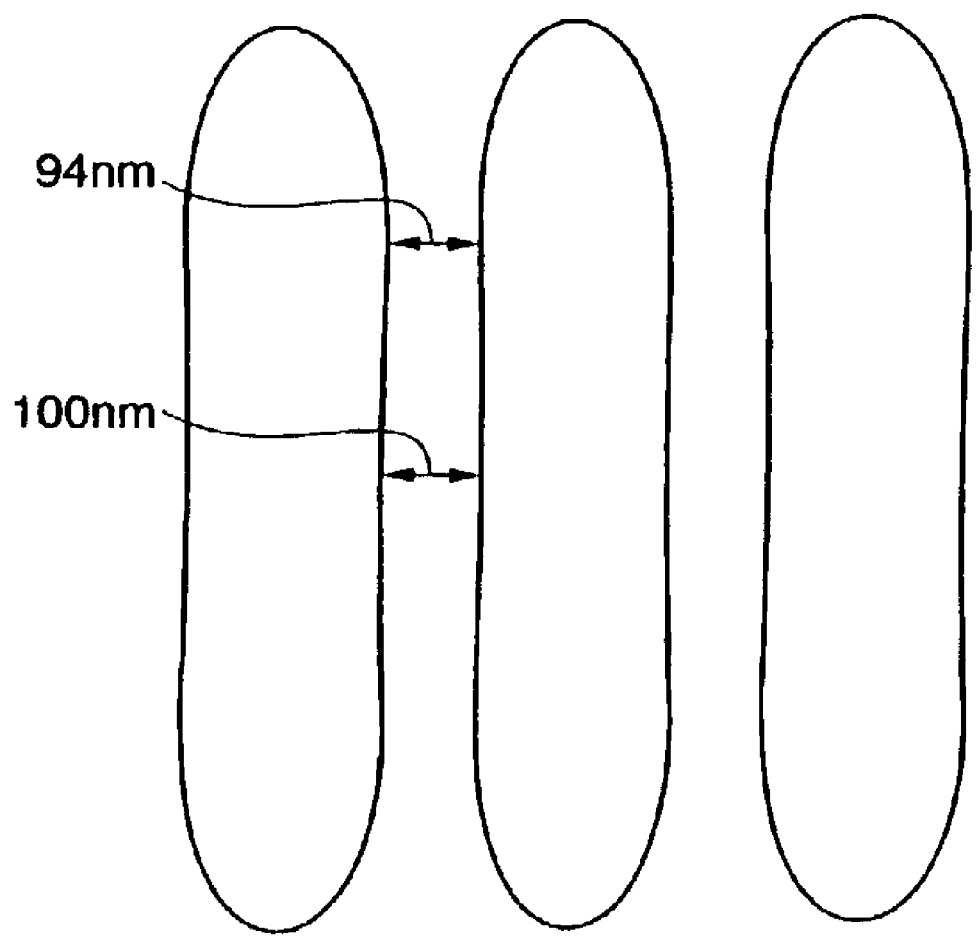
FIG. 16 shows the extracted distribution of light intensity when a line width at the center parts of the phase shifters becomes 100 nm from FIG. 15.

FIG. 16 shows extracted patterns where line widths at center parts of the phase shifters become 100 nm based on the results of simulation of the light intensity of FIG. 15. As shown in FIG. 16, when the line widths are determined by the threshold of light intensity where the line widths at the center parts become 100 nm, the line widths becomes narrower at the ends in the longitudinal direction. The line widths become 94 nm at the minimum.

Comparing FIG. 16 with FIG. 13, it is found that the evenness of line widths of the miniaturized patterns on the active region is improved by the Levenson phase shift mask of the present embodiment.

A method of exposure and method of producing a semiconductor device of the present embodiment include a step of photolithography using a Levenson phase shift mask formed with the phase shifters of the present embodiment. Due to this, it becomes possible to form a miniaturized pattern exceeding a resolution limit determined by the wavelength of the light and optical system by a uniform line width.

According to the phase shift mask, method of exposure, and method of producing a semiconductor device of the above embodiment of the present invention, it is possible to form a miniaturized pattern by a uniform line width.

Note that the present invention is not limited to the above embodiments and includes modifications within the scope of the claims. For example, it is possible to change the shape and size of the correction pattern in accordance with the results of simulation of the light intensity.

Summarizing the effects of the invention, according to the phase shift mask of the present invention, it is possible to prevent a fluctuation in line width of a miniaturized pattern on an active region.

According to the method of exposure of the present invention, it becomes possible to prevent a fluctuation in line width in a process of production of a miniaturized pattern including exposure using a Levenson phase shift mask.

According to the method of producing a semiconductor device of the present invention, it is possible to form a miniaturized pattern by a uniform line width in a photolithography process.

What is claimed is:

1. A phase shift mask comprising:
   a first phase shifter through which light passes by a first optical path length;
   a second phase shifter through which light passes by a second optical path length inverted in an optical phase from the first optical path length, the second phase shifter formed away from the first phase shifter by a predetermined distance;
   a light-blocking part formed around the first phase shifter and second phase shifter; and
   a correction pattern provided at a part of at least one of the first phase shifter and second phase shifter for correcting a distribution of light intensity between light passing through the first phase shifter and light passing through the second phase shifter, said correction pattern comprising oppositely facing jog parts positioned at opposite ends of said first and second phase shifters, wherein at least one phase shifter is elongated at both ends in the longitudinal direction relative to the gate width.

2. A phase shift mask as set forth in claim 1, wherein:
   the first phase shifter and second phase shifter are shaped so that the light intensity is canceled out in a line shape between the light passing through the first phase shifter and the light passing through the second phase shifter; and
   the correction pattern is shaped so that a line width of the line-shaped part becomes constant.

3. A phase shift mask as set forth in claim 2, wherein the correction pattern is shaped to cut away at least one corner of at least one of the first and second phase shifter.

4. A phase shift mask as set forth in claim 2, wherein a length of a portion where the first phase shifter and second phase shifter face each other is longer than a desired length of the line-shaped portion.

5. A phase shift mask as set forth in claim 4, wherein the facing portion includes parts outside of the two ends of the line-shaped portion in a longitudinal direction.

6. A phase shift mask as set forth in claim 1, wherein:
   the mask has a plurality of at least the first phase shifter, and
   the first phase shifters are arranged via the second phase shifter.

7. A method of exposure performing a first exposure via a phase shift mask comprising:
   a first phase shifter through which light passes by a first optical path length;
   a second phase shifter through which light passes by a second optical path length inverted in an optical phase from the first optical path length, the second phase shifter formed away from the first phase shifter by a predetermined distance;
   a light-blocking part formed around the first phase shifter and second phase shifter; and
   a correction pattern provided at a part of at least one of the first phase shifter and second phase shifter for correcting a distribution of light intensity between light passing through the first phase shifter and light passing through the second phase shifter, said correction pattern comprising oppositely facing jog parts positioned at opposite ends of said first and second phase shifters, wherein at least one phase shifter is elongated at both ends in the longitudinal direction relative to the gate width.

8. A method of exposure as set forth in claim 7, wherein:
   the first phase shifter and second phase shifter are shaped so that the light intensity is canceled out in a line shape between the light passing through the first phase shifter and the light passing through the second phase shifter; and
   the correction pattern is shaped so that a line width of the line-shaped part becomes constant.

9. A method of exposure as set forth in claim 7, further comprising, before or after the first exposure, a step of second exposure via a second mask formed with a different pattern from the phase shift mask.

10. A method of exposure as set forth in claim 8, wherein the correction pattern is shaped to cut away at least one corner of at least one of the first and second phase shifter.

11. A method of exposure as set forth in claim 8, wherein a length of a portion where the first phase shifter and second phase shifter face each other is longer than a desired length of the line-shaped portion.

12. A method of exposure as set forth in claim 11, wherein the facing portion includes parts outside of the two ends of the line-shaped portion in a longitudinal direction.

13. A method of producing a semiconductor device including a step of focusing light on a substrate via a phase shift mask to transfer a pattern to the substrate, said phase shift mask comprising:

a first phase shifter through which light passes by a first optical path length;

a second phase shifter through which light passes by a second optical path length inverted in an optical phase from the first optical path length, the second phase shifter formed away from the first phase shifter by a predetermined distance;

a light-blocking part formed around the first phase shifter and second phase shifter; and a correction pattern provided at a part of at least one of the first phase shifter and second phase shifter for correcting a distribution of light intensity between light passing through the first phase shifter and light passing through the second phase shifter, said correction pattern comprising oppositely facing jog parts positioned at opposite ends of said first and second phase shifters, wherein at least one phase shifter is elongated at both ends in the longitudinal direction relative to the gate width.

* * * * *